United States Patent
Moon et al.

(10) Patent No.: US 9,764,956 B2
(45) Date of Patent: Sep. 19, 2017

(54) METHOD FOR MANUFACTURING GRAPHENE, SAID GRAPHENE, AND APPARATUS FOR MANUFACTURING SAME

(71) Applicant: LG ELECTRONICS INC., Seoul (KR)

(72) Inventors: Jinsan Moon, Seoul (KR); Jonghyun Rho, Seoul (KR); Subeom Park, Seoul (KR); Taehyeong Kim, Seoul (KR); Byunghee Hong, Suwon-si (KR); Wonbae Park, Seoul (KR); Myunghee Jung, Seoul (KR)

(73) Assignees: LG ELECTRONICS INC., Seoul (KR); SNU R&DB FOUNDATION, Seoul (KR)

( * ) Notice: Subject to any disclaimer, the term of this patent is extended or adjusted under 35 U.S.C. 154(b) by 69 days.

(21) Appl. No.: 14/423,463

(22) PCT Filed: Aug. 1, 2013

(86) PCT No.: PCT/KR2013/006955
§ 371 (c)(1),
(2) Date: Feb. 24, 2015

(87) PCT Pub. No.: WO2014/035068
PCT Pub. Date: Mar. 6, 2014

(65) Prior Publication Data
US 2015/0368109 A1 Dec. 24, 2015

(30) Foreign Application Priority Data

Aug. 30, 2012 (KR) .................. 10-2012-0095624
Apr. 25, 2013 (KR) .................. 10-2013-0046060

(51) Int. Cl.
C23C 16/26 (2006.01)
C01B 31/04 (2006.01)
(Continued)

(52) U.S. Cl.
CPC ...... *C01B 31/0453* (2013.01); *C23C 16/0209* (2013.01); *C23C 16/26* (2013.01); *C23C 16/44* (2013.01)

(58) Field of Classification Search
CPC ...... C23C 16/26; C23C 16/0209; C23C 16/44
(Continued)

(56) References Cited

U.S. PATENT DOCUMENTS

2006/0225831 A1* 10/2006 Lei .................. B29C 47/0047
156/229
2010/0038468 A1* 2/2010 Hein .................. B65H 23/0204
242/419.8
(Continued)

FOREIGN PATENT DOCUMENTS

CN 102173406 A 9/2011
JP 2011-006265 A 1/2011
(Continued)

OTHER PUBLICATIONS

Chinese Office Action dated Nov. 2, 2015 issued in Application No. 201380045441.7 (with English Translation).
International Search Report dated Oct. 28, 2013 issued in Application No. PCT/KR2013/006955.

*Primary Examiner* — Elizabeth Burkhart
(74) *Attorney, Agent, or Firm* — KED & Associates, LLP

(57) ABSTRACT

The present invention provides a method for manufacturing graphene, said graphene, and an apparatus for manufacturing same. The method for manufacturing graphene comprises the steps of: loading a catalytic metal layer into a chamber; applying tensile force to the catalytic metal layer; and forming graphene on the catalytic metal layer by supplying a carbon source into the chamber while the tension is applied to the catalytic metal layer. Therefore, the size of the grains on the catalytic metal layer can be increased by applying tension to the catalytic metal layer, and high quality (Continued)

uniform graphene can be grown through the use of the catalytic metal layer.

13 Claims, 4 Drawing Sheets

(51) Int. Cl.
*C23C 16/02* (2006.01)
*C23C 16/44* (2006.01)

(58) Field of Classification Search
USPC .............................. 427/249.1, 249.6; 118/718
See application file for complete search history.

(56) References Cited

U.S. PATENT DOCUMENTS

| | | | |
|---|---|---|---|
| 2011/0195207 A1* | 8/2011 | Hong | C23C 16/26 428/34.1 |
| 2013/0052121 A1* | 2/2013 | Hasegawa | B82Y 30/00 423/448 |
| 2014/0017160 A1 | 1/2014 | Song et al. | |

FOREIGN PATENT DOCUMENTS

| | | |
|---|---|---|
| KR | 10-2011-0092417 A | 8/2011 |
| KR | 10-2012-0061224 A | 6/2012 |
| KR | 10-1168259 B1 | 7/2012 |
| KR | 10-2012-0088524 A | 8/2012 |
| WO | WO 2011/105530 * | 9/2011 |
| WO | WO 2011/105530 A1 | 9/2011 |
| WO | WO 2012/105777 * | 8/2012 |

* cited by examiner (a) Without Tension (b) With Tension

METHOD FOR MANUFACTURING GRAPHENE, SAID GRAPHENE, AND APPARATUS FOR MANUFACTURING SAME

CROSS-REFERENCE TO RELATED PATENT APPLICATIONS

This application is a U.S National Stage Application under 35 U.S.C. §371 of PCT Application No. PCT/KR2013/006955, filed Aug. 1, 2013, which claims priority to Korean Patent Application Nos. 10-2012-0095624, filed Aug. 30, 2012 and 10-2013-G0046060, filed on Apr. 25, 2013, whose entire disclosures are hereby incorporated by reference.

TECHNICAL FIELD

The present invention relates to graphene and, more particularly, to a method for manufacturing graphene using tension, the graphene, and an apparatus for manufacturing the same.

BACKGROUND ART

Substances containing carbon atoms include fullerene, carbon nanotube, graphene, and graphite, for example. Of these, graphene is a single atom layer whose structure is a two-dimensional planar array of carbon atoms.

In particular, graphene has considerably stable and superior electrical, mechanical and chemical properties as well as excellent conductivity and thus more rapidly carries electrons than silicone and enables application of higher electrical current than copper, which has been actively researched since it was demonstrated through experimentation based on discovery of a method of separating graphene from graphite in 2004.

Graphene has attracted considerable attention as a base material for electronic circuits because it may be produced on a large scale and has electrical, mechanical and chemical stability as well as excellent conductivity.

In addition, electrical properties of graphene may change according to crystal direction of graphene with a predetermined thickness. For this reason, electrical properties are obtained in a direction selected by a user and devices can thus be easily designed. Accordingly, graphene may be effectively used for carbon-based electronic or electromagnetic devices.

DISCLOSURE

Technical Problem

An object of the present invention devised to solve the problem lies in a method for manufacturing graphene, the graphene, and an apparatus for manufacturing the same, which ensure manufacturing of high quality uniform graphene.

Technical Solution

In one aspect of the present invention, the object of the present invention can be achieved by providing a method for manufacturing graphene. The method for manufacturing graphene includes loading a catalyst metal layer into a chamber, applying tension to the catalyst metal layer, and forming graphene on the catalyst metal layer by supplying a carbon source into the chamber in a state in which the tension is applied to the catalyst metal layer.

In another aspect of the present invention, provided herein is an apparatus for manufacturing graphene including a chamber having a gas inlet and a gas outlet, the chamber being configured to allow a catalyst metal layer to be loaded thereinto, and a tension unit configured to apply tension to the catalyst metal layer loaded into the chamber.

Advantageous Effects

According to the present invention, it is possible to increase the grain size of a catalyst metal layer by applying tension to the catalyst metal layer and to achieve growth of high quality uniform graphene through use of the catalyst metal layer.

In addition, it is possible to change an orientation of the catalyst metal layer into (111) orientation by applying tension to the catalyst metal layer and to achieve growth of high quality uniform graphene through use of the catalyst metal layer.

The technical effects of the present invention are not limited to those described above and other technical effects not described herein will be clearly understood by those skilled in the art from the following description.

MODE FOR INVENTION

Hereinafter, embodiments of the present invention will be described in detail with reference to the accompanying drawings.

The present invention allows various modifications and variations and specific embodiments thereof are exemplified with reference to drawings and will be described in detail. The present invention should not be construed as limited to the embodiments set forth herein and includes modifications, variations, equivalents, and substitutions compliant with the spirit or scope of the present invention defined by the appended claims.

It will be understood that when an element such as a layer, area or substrate is referred to as being "on" another element, it can be directly on the element, or one or more intervening elements may also be present therebetween.

In addition, it will be understood that although terms such as "first" and "second" may be used herein to describe elements, components, areas, layers and/or regions, the elements, components, areas, layers and/or regions should not be limited by these terms.

Embodiment

Figure 1:
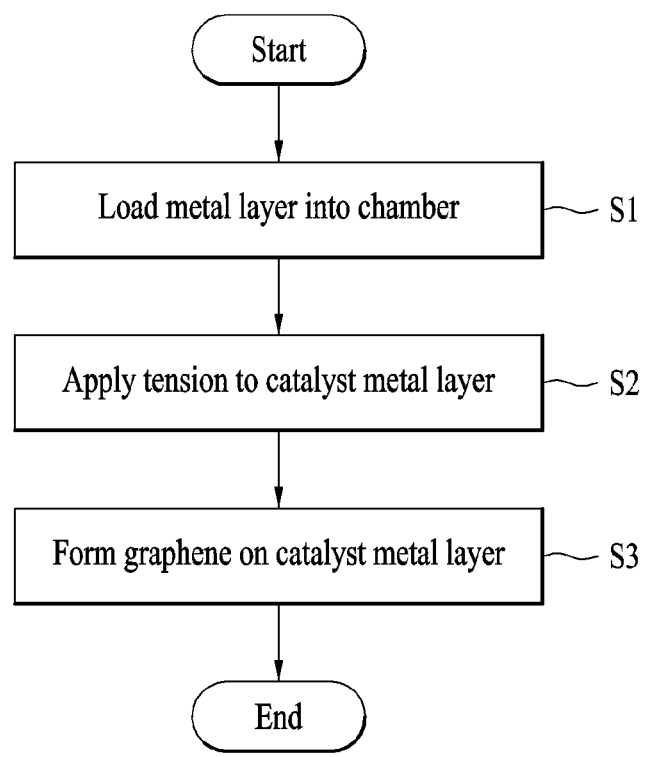
FIG. 1 is a flowchart schematically showing a method for manufacturing graphene according to an embodiment of the present invention.

FIG. 1 is a flowchart schematically showing a method for manufacturing graphene according to an embodiment of the present invention.

Referring to FIG. 1, the method for manufacturing graphene includes loading a catalyst metal layer into a chamber (S1), applying tension to the catalyst metal layer (S2), and forming graphene on the catalyst metal layer (S3).

The step of loading the catalyst metal layer into the chamber (S1), for example, may use chambers of various deposition devices. For example, the chamber may be a horizontal chemical vapor deposition (CVD) chamber or a vertical CVD chamber of a CVD device. For example, the catalyst metal layer may be loaded into the horizontal CVD chamber.

The catalyst metal layer may be formed of a metal capable of forming graphene, for example, any one selected from the group consisting of nickel (Ni), cobalt (Co), iron (Fe), platinum (Pt), gold (Au), aluminum (Al), chrome (Cr), copper (Cu), magnesium (Mg), manganese (Mn), molybdenum (Mo), rhodium (Rh), silicon (Si), tantalum (Ta), titanium (Ti), tungsten (W), uranium (U), vanadium (V), and zirconium (Zr), and may be formed of a single layer of any one of these components or alloys of at least two of these components.

The catalyst metal layer may be a single metal layer formed of a catalyst metal alone, or may be coupled with another member. For example, a catalyst metal may be disposed on one surface of a silicon substrate including silicon oxide ($SiO_2$).

Meanwhile, the catalyst metal layer may take the form of a wafer or foil. For example, the catalyst metal layer may be copper (Cu) foil.

A thickness of the catalyst metal layer may be within a range of 10 μm to 50 μm. When the thickness of the catalyst metal layer is below 10 μm, it is impossible to sufficiently increase the magnitude of tension to be applied to the catalyst metal layer.

In addition, when the thickness of the catalyst metal layer is above 50 μm, the catalyst metal layer is increased only in thickness while maintaining a constant contact area with a carbon source, which may cause reduced economic efficiency.

In the step of applying tension to the catalyst metal layer (S2), tension may be applied to the catalyst metal layer through use of an element capable of applying tension to the catalyst metal layer.

For example, in the case in which the catalyst metal layer is vertically loaded into the chamber, tension may be applied vertically or horizontally to the catalyst metal layer.

More specifically, the catalyst metal layer may be loaded into a vertical CVD chamber, the loaded catalyst metal layer may be suspended in a batch manner, and an element capable of applying tension may be connected to the bottom of the catalyst metal layer, whereby tension may be applied vertically to the catalyst metal layer.

In addition, in the case in which the catalyst metal layer is horizontally loaded into the chamber, tension may be applied to both sides of the catalyst metal layer.

Meanwhile, in the case in which the catalyst metal layer is loaded in a so-called roll-to-roll manner so as to be successively fed by rollers, tension may be applied to the catalyst metal layer at an entrance side and/or an exit side of the chamber.

An apparatus capable of forming graphene by applying tension to the catalyst metal layer as described above will be described later in detail.

The magnitude of tension may be within a range of 0.1 kg/m to 5 kg/m. When the magnitude of tension is below 0.1 kg/m, it is impossible to increase the grain size of the catalyst metal layer to a desired level. When the magnitude of tension is above 5 kg/m, the catalyst metal layer may fail to ensure the tension, thus causing damage, such as tearing.

Through application of tension as described above, the grain size of the catalyst metal layer may be increased. For example, the average grain size of the catalyst metal layer, to which the tension as described above is applied, may be within a range of 100 μm to 500 μm. By increasing the grain size of the catalyst metal layer as described above, an area that ensures uniform diffusion of separated carbon atoms into grains may be increased, which may result in formation of high quality graphene. In addition, the applied tension may cause change in the orientation of the catalyst metal layer. For example, when tension is applied to copper foil having (001) orientation, the orientation of the copper foil may be changed to (111) orientation.

Considering this orientation change in terms of surface energy depending on a crystalline structure, (111) orientation has superior charge rate and stability to (001) orientation. In addition, (111) orientation is similar to a crystalline structure of graphene. Accordingly, upon synthesis of graphene on the (111) oriented catalyst metal layer, more uniform and less defective graphene than that upon synthesis in (001) orientation may be acquired.

In this way, by changing orientation of the catalyst metal layer into (111) orientation via application of tension as described above, high quality graphene may be formed.

Meanwhile, the step of applying tension to the catalyst metal layer (S2) may further include performing thermal treatment of the catalyst metal layer. The thermal treatment temperature may be 300° C. or more.

Adding the thermal treatment step in a state in which tension is applied to the catalyst metal layer may facilitate change in the orientation of the catalyst metal layer and allow the catalyst metal layer to have a single orientation. As the catalyst metal layer has a single orientation, high quality uniform graphene may be synthesized.

In the step of forming graphene on the catalyst metal layer (S3), a carbon source is supplied into the chamber to form graphene on the catalyst metal layer.

In this case, graphene may be formed on the catalyst metal layer using various deposition methods. For example, graphene may be synthesized within the chamber via chemical vapor deposition using a catalyst metal.

Examples of the chemical vapor deposition include a thermal chemical vapor deposition (T-CVD), inductively coupled plasma chemical vapor deposition (ICP-CVD), plasma enhanced chemical vapor deposition (PE-CVD), and microwave chemical vapor deposition (microwave CVD).

In addition, various other methods, such as rapid thermal annealing (RTA), atomic layer deposition (ALD), and physical vapor deposition (PVD) methods, may be used.

Examples of the carbon source include gas type sources, such as methane ($CH_4$) and acetylene ($C_2H_2$), solid type sources, such as powder and polymer, or liquid type sources, such as bubbling alcohol.

In addition, various other carbon sources, such as ethane, ethylene, ethanol, acetylene, propane, butane, butadiene, pentane, pentene, cyclopentadiene, hexane, cyclohexane, benzene, and toluene, may be used.

The case in which the catalyst metal layer is formed of copper (Cu) and the carbon source is methane ($CH_4$) will be described below by way of example.

Methane gas is introduced into a hydrogen atmosphere on a catalyst metal layer formed of copper while maintaining an appropriate temperature of the catalyst metal layer. When the interior temperature of the chamber is raised to a given value, the methane gas is separated into carbon atoms and hydrogen atoms. The separated carbon atoms are absorbed by or deposited on a surface of the catalyst metal layer.

Subsequently, the separated carbon atoms are diffused into grains of the catalyst metal layer. At this time, the interior temperature of the chamber may be within a range of approximately 300° C. to 1500° C.

Thereafter, as the catalyst metal layer, by or on the surface of which the carbon atoms are absorbed or deposited, is cooled, graphene is formed. The carbon atoms absorbed by the surface of the catalyst metal layer are synthesized on the surface of the catalyst metal layer as the catalyst metal layer is cooled.

Cooling of the catalyst metal layer may be performed within a relatively short time. In addition, cooling of the catalyst metal layer may be performed within the chamber, or may be performed at the outside of the chamber after the catalyst metal layer is discharged from the chamber.

Copper used in the catalyst metal layer has low carbon solubility and may be advantageous in formation of graphene of a mono-layer.

Meanwhile, after the step of forming graphene, the method may further include removing the catalyst metal layer, although not shown. The catalyst metal layer may be removed by etching. For example, a catalyst metal layer formed of nickel may be removed using a $FeCl_3$ etchant as needed.

In addition, the catalyst metal layer may be removed after stacking a carrier member on the graphene. For example, the catalyst metal layer may be removed using polydimethylsiloxane (PDMS).

Through the above-described process, the grain size of the catalyst metal layer may be increased by applying tension to the catalyst metal layer, and high quality uniform graphene may be grown through use of the catalyst metal layer having the increased grain size.

In addition, orientation of the catalyst metal layer may be changed to (111) orientation as tension is applied to the catalyst metal layer, and high quality uniform graphene may be grown through use of the (111) oriented catalyst metal layer.

MANUFACTURING EXAMPLE

Graphene was synthesized using a vertical CVD device. A catalyst metal layer formed of copper was loaded into a vertical CVD chamber. Then, a carbon source was fed into the chamber in a state in which tension of about 1 kg/m is vertically applied to the catalyst metal layer, so as to form graphene.

At this time, $CH_4$ gas was fed at a rate of 50 sccm to 100 sccm and the interior pressure of the chamber was within a range of 0.2 Torr to 1 Torr.

In addition, while the interior temperature of the chamber was raised to about 1000° C., graphene was formed on the catalyst metal layer.

COMPARATIVE EXAMPLE

Graphene was formed in substantially the same manner as the above manufacturing example except that no tension was applied to the catalyst metal layer.

EXPERIMENTAL EXAMPLE

After synthesizing graphene according to the comparative example and the manufacturing example, grain and orientation mapping of the catalyst metal layer was performed.

Figure 2:
FIG. 2 shows images of measured grain sizes of catalyst metal layers after synthesis of graphene according to a comparative example and a manufacturing example.
Figure 2:

FIG. 2 shows images of measured grain sizes of the catalyst metal layers after synthesis of graphene according to the comparative example and the manufacturing example.

FIG. 2(a) shows a grain mapping image of the catalyst metal layer after synthesis of graphene according to the comparative example. In this case, graphene is synthesized in a state in which no tension is applied to the catalyst metal layer.

FIG. 2(b) shows a grain mapping image of the catalyst metal layer after synthesis of graphene according to the manufacturing example. In this case, graphene is synthesized in a state in which tension is applied to the catalyst metal layer.

As can be seen from FIGS. 2(a) and 2(b), the grain size of the catalyst metal layer according to the manufacturing example is remarkably increased as compared to the catalyst metal layer of the comparative example. Accordingly, it can be appreciated that the grain size of the catalyst metal layer is increased as tension is applied to the catalyst metal layer.

Figure 3:
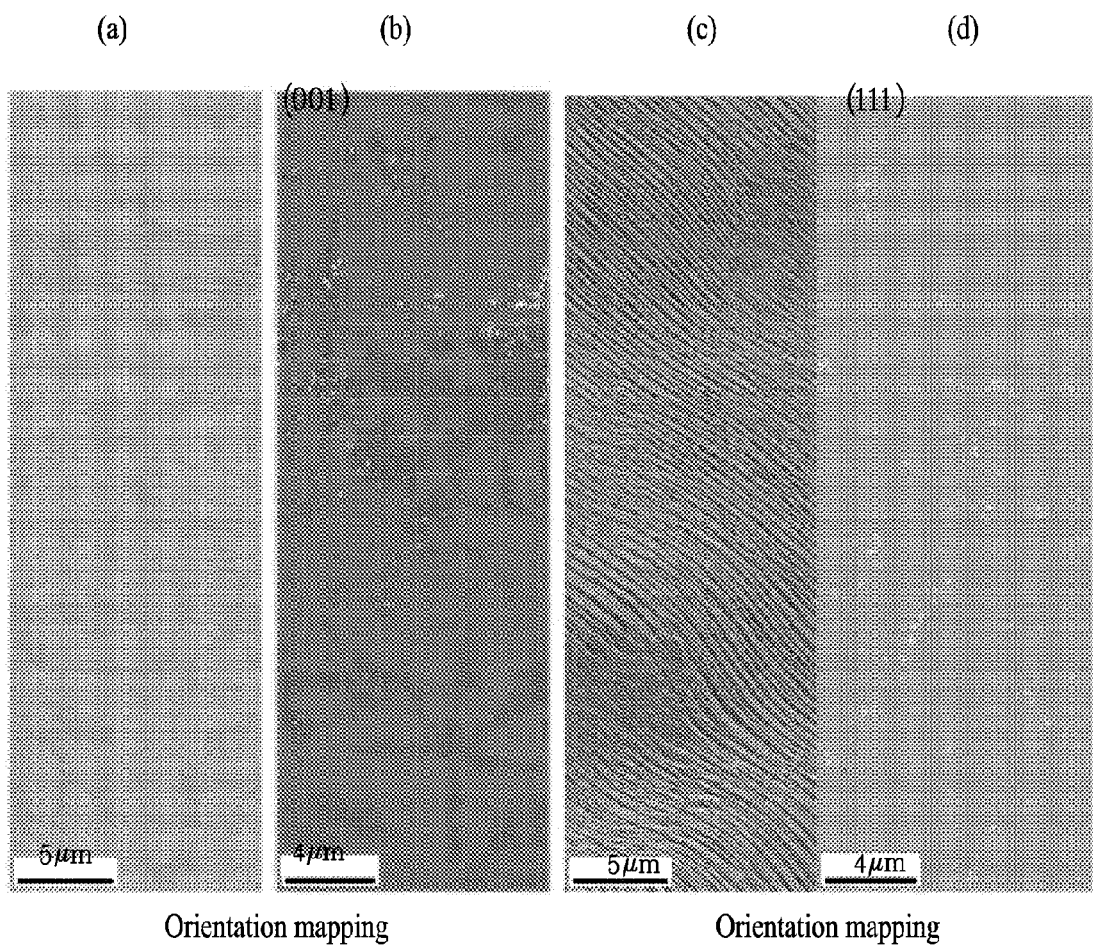
FIG. 3 shows images of measured orientations of a catalyst metal layer after synthesis of graphene according to a comparative example and a manufacturing example.

FIG. 3 shows images of measured orientations of the catalyst metal layers after synthesis of graphene according to the comparative example and the manufacturing example.

FIGS. 3(a) and 3(b) show orientation mapping images of the catalyst metal layer after synthesis of graphene according to the comparative example. FIGS. 3(a) and 3(b) show the same image, and FIG. 3(b) is colored according to directions.

FIGS. 3(c) and 3(d) show orientation mapping images of the catalyst metal layer after synthesis of graphene according to the manufacturing example. FIGS. 3(c) and 3(d) show the same image, and FIG. 3(d) is colored according to directions.

As can be seen from FIGS. 3(a) to 3(d), the catalyst metal layer according to the comparative example has (001) orientation and the catalyst metal layer according to the manufacturing example has (111) orientation. Accordingly, it can be appreciated that the catalyst metal layer is changed from (001) orientation to (111) orientation as tension is applied to the catalyst metal layer.

Manufacturing Apparatus

Figure 4:
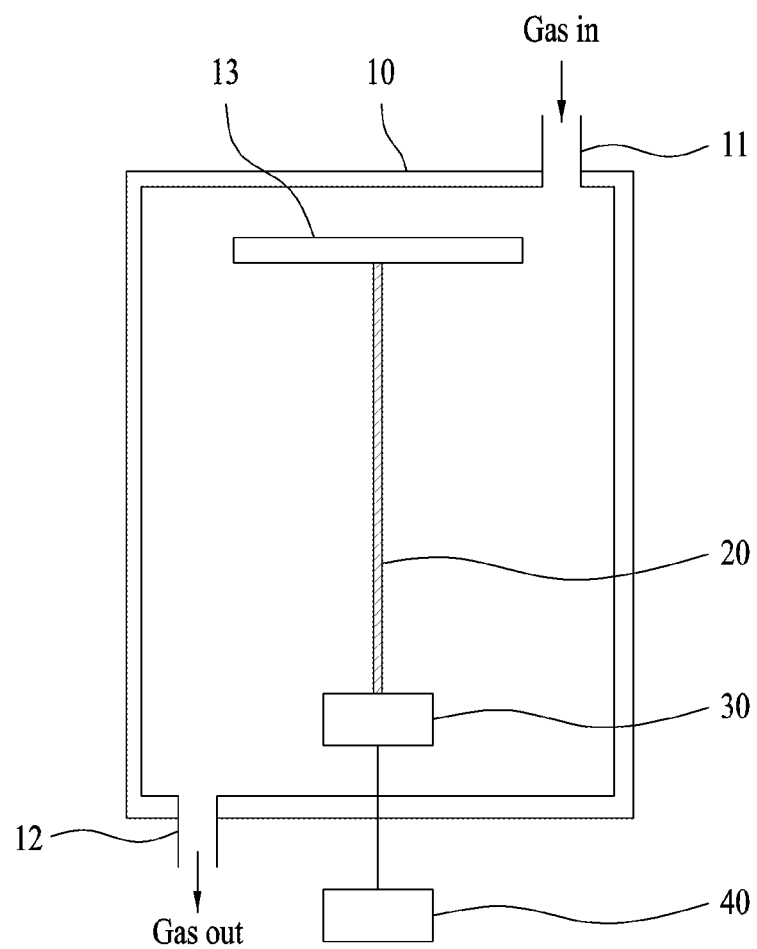
FIG. 4 is a schematic view showing one example of an apparatus for manufacturing graphene.
Figure 5:
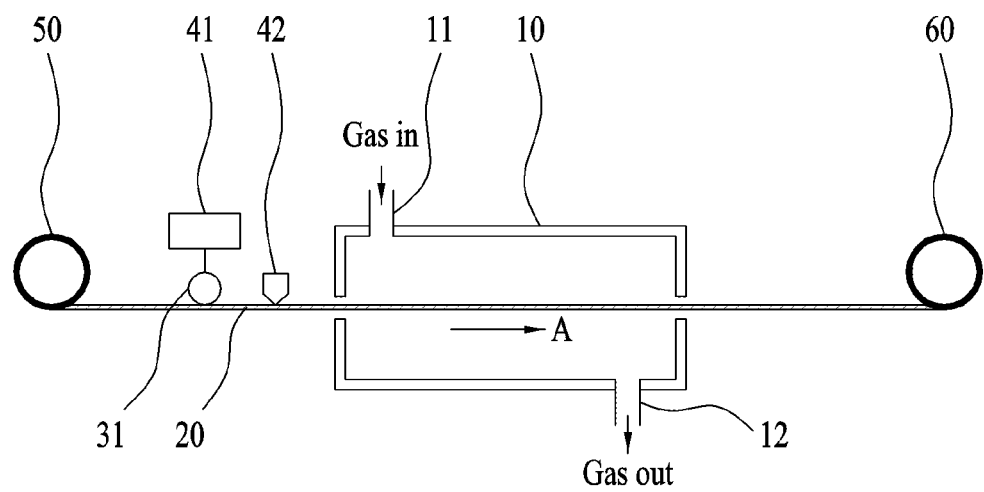
FIG. 5 is a schematic view showing another example of an apparatus for manufacturing graphene.

FIGS. 4 and 5 illustrate a manufacturing apparatus for synthesizing graphene according to the manufacturing example of the present invention.

FIG. 4 shows an apparatus in which a catalyst metal layer 20 is vertically loaded into a chamber 10, and FIG. 5 shows an apparatus in which the catalyst metal layer 10 is supplied into the chamber 10 in a roll-to-roll manner.

First, the apparatus shown in FIG. 4 will be described. The apparatus for manufacturing graphene includes the chamber 10 into which the catalyst metal layer 20 is vertically oriented and loaded. The chamber 10 is provided with a gas inlet 11 and a gas outlet 12.

A support member 13 is placed within the chamber 10. The support member 13 supports the catalyst metal layer 20 to allow the catalyst metal layer 20 to be vertically loaded.

A tension unit 30 may be connected to an opposite side of the catalyst metal layer 20 supported by the support member 13.

In one example, the tension unit 30 may be a weight having a given weight.

In another example, the tension unit may be an elastic member. One example of the elastic member may be a spring member. At this time, one end of the spring member may be connected to the catalyst metal layer 20 and the other end may be secured to the chamber 10.

Through use of the tension unit 30 exemplified by the weight or the secured spring member, tension to be applied to the catalyst metal layer 20 may be adjusted to be kept at a constant value.

However, a configuration to apply variable tension to the catalyst metal layer 20 is also possible. That is, tension is adjustable.

For example, the other end of the tension unit 30 in the form of the weight or the spring member may be connected to a tension adjustment unit 40 that is movably installed. Thereby, tension to be applied to the catalyst metal layer 20 may be adjusted via operation of the tension adjustment unit 40.

Next, the roll-to-roll apparatus shown in FIG. 5 will be described. The same reference numerals are used to designate the same components as those of FIG. 4.

The catalyst metal layer 20 is unrolled from a feed roller 50 and fed through the chamber 10 in a direction A to thereby be wound around a winding roll 60.

As mentioned above, the chamber 10 is provided with the gas inlet 11 and the gas outlet 12.

A tension unit 31 to apply tension to the catalyst metal layer 20 may be located out of one side of the chamber 10, e.g., an entrance side of the chamber 10 to which the catalyst metal layer 20 is fed.

One example of the tension unit 31 may be a roller.

In addition, a tension adjustment unit 41 capable of adjusting tension may be provided to allow tension to be applied to the catalyst metal layer 20 to be variable.

That is, the tension unit 31 may be connected to the tension adjustment unit 41 so as to be moved by the tension adjustment unit 41. Thereby, tension to be applied to the catalyst metal layer 20 may be adjusted via operation of the tension adjustment unit 41.

At this time, there may further be provided a tension measurement unit 42 capable of measuring tension applied to the catalyst metal layer 20 by the tension unit 31. Accordingly, the tension adjustment unit 41 is capable of more accurately adjusting tension to be applied to the catalyst metal layer 20 according to a measured value of the tension adjustment unit 42, and this process may be automatically performed.

The tension unit 31 may have an elastic structure, such as a spring, therein to come into elastic contact with the catalyst metal layer 20.

In another example, the tension unit 31 and the tension adjustment unit 41 may be connected to each other using a separate elastic member interposed therebetween.

Meanwhile, while FIG. 5 shows an example in which the tension unit 31 is located at or near the entrance side of the chamber 10 to which the catalyst metal layer 20 is introduced, as occasion demands, the catalyst metal layer 20 may be installed at or near an exit side of the chamber 10 from which the catalyst metal layer 20 is discharged.

In addition, a pair of tension units may be installed respectively at or near the entrance side and the exit side of the chamber 10 and, as occasion demands, the tension unit may be installed within the chamber 10.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

INDUSTRIAL APPLICABILITY

According to the present invention, high quality uniform graphene may be grown by applying tension to a catalyst metal layer.

The high quality graphene has excellent electrical and physical characteristics and may be used in a variety of electronic devices including a display device.

The invention claimed is:

1. A method for manufacturing graphene, the method comprising:
   loading a catalyst metal layer into a chamber;
   applying tension to the catalyst metal layer using a weight or an elastic member connected to one end of the catalyst metal layer so as to change orientation of the catalyst metal layer;
   measuring the tension applied to the catalyst metal layer;
   adjusting the tension applied to the catalyst metal layer according to a measured value of the tension; and
   forming graphene on the catalyst metal layer by supplying a carbon source into the chamber in a state in which the tension is applied to the catalyst metal layer.

2. The method according to claim 1, wherein the tension has a magnitude within a range of 0.1 kg/m to 5 kg/m.

3. The method according to claim 1, wherein the tensioned catalyst metal layer have an average grain size within a range of 100 μm to 500 μm.

4. The method according to claim 1, wherein the orientation of the catalyst metal layer is changed to (111) orientation.

5. The method according to claim 1, wherein the catalyst metal layer has a thickness within a range of 10 μm to 50 μm.

6. The method according to claim 1, wherein the applying includes performing thermal treatment of the catalyst metal layer in a state in which the tension is applied to the catalyst metal layer.

7. The method according to claim 1, wherein the applying includes applying the tension in a first direction or in a second direction perpendicular to the first direction, the first direction being a loading direction of the catalyst metal layer.

8. The method according to claim 1, wherein the loading includes vertically loading the catalyst metal layer in a direction perpendicular to a ground surface.

9. The method according to claim 8, wherein the applying includes applying the tension using gravity.

10. The method according to claim 1, wherein the applying serves to increase a grain size of graphene formed on the catalyst metal layer.

11. The method according to claim 10, wherein the catalyst metal layer has an average grain size within a range of 100 μm to 500 μm.

12. The method according to claim 1, wherein the tension applied to the catalyst metal layer by the weight or the elastic member is adjustable.

13. The method according to claim 12, wherein measuring the tension applied to the catalyst metal layer and adjusting the tension applied to the catalyst metal layer are automatically performed such that the tension has a preset value.

* * * * *